United States Patent
Catabay et al.

(10) Patent No.: US 6,537,896 B1
(45) Date of Patent: Mar. 25, 2003

(54) PROCESS FOR TREATING POROUS LOW K DIELECTRIC MATERIAL IN DAMASCENE STRUCTURE TO FORM A NON-POROUS DIELECTRIC DIFFUSION BARRIER ON ETCHED VIA AND TRENCH SURFACES IN THE POROUS LOW K DIELECTRIC MATERIAL

(75) Inventors: Wilbur G. Catabay, Saratoga, CA (US); Wei-Jen Hsia, Sunnyvale, CA (US)

(73) Assignee: LSI Logic Corporation, Milpitas, CA (US)

( * ) Notice: Subject to any disclaimer, the term of this patent is extended or adjusted under 35 U.S.C. 154(b) by 0 days.

(21) Appl. No.: 10/007,405

(22) Filed: Dec. 4, 2001

(51) Int. Cl.$^7$ ............................................... H01L 21/322
(52) U.S. Cl. ........................ 438/474; 438/475; 438/477
(58) Field of Search ................................. 438/622, 624, 438/474, 475, 477, 963, 798, 781, 784, 782, 634, 760, 958, 628, 637, 666

(56) References Cited

U.S. PATENT DOCUMENTS

| | | | |
|---|---|---|---|
| 5,210,466 A | * 5/1993 | Collins et al. | 315/111.21 |
| 5,393,712 A | 2/1995 | Rostoker et al. | 437/238 |
| 5,413,772 A | * 5/1995 | Pinneo | 423/446 |
| 5,470,801 A | 11/1995 | Kapoor et al. | 437/238 |
| 5,545,030 A | * 8/1996 | Pinneo | 428/408 |
| 5,598,026 A | 1/1997 | Kapoor et al. | 257/634 |
| 5,707,486 A | * 1/1998 | Collins | 156/643.1 |
| 5,864,172 A | 1/1999 | Kapoor et al. | 257/634 |
| 5,874,367 A | 2/1999 | Dobson | 438/787 |
| 5,883,001 A | * 3/1999 | Jin et al. | 438/624 |
| 5,930,655 A | * 7/1999 | Cooney, III et al. | 438/474 |
| 5,989,998 A | 11/1999 | Sugahara et al. | |
| 6,043,145 A | * 3/2000 | Suzuki et al. | 438/622 |
| 6,054,379 A | 4/2000 | Yau | |
| 6,063,702 A | 5/2000 | Chung | |
| 6,114,259 A | 9/2000 | Sukharev et al. | 438/789 |
| 6,215,087 B1 | 4/2001 | Akahori et al. | |

OTHER PUBLICATIONS

Bothra, S., et al., "Integration of 0.25 μm Three and Five Level Interconnect System for High Performance ASIC", *1997 Proceedings Fourteenth International VMIC Conference*, Santa Clara, CA, Jun. 10–12, 1997, pp. 43–48.

Dobson, C.D., et al., "Advanced SiO$_2$ Planarization Using Silane and H$_2$O$_2$", *Semiconductor International*, Dec. 1994, pp. 85–88.

McClatchie, S., et al., "Low Dielectric Constant Oxide Films Deposited Using CVD Techniques", *1998 Proceedings Fourth International DUMIC Conference*, Feb. 16–17, 1998, pp. 311–318.

Peters, Laura, "Low–k Dielectrics: Will Spin–On or CVD Prevail?", *Semiconductor International*, vol. 23, No. 6, Jun., 2000, pp. 108–110, 114, 116, 118, 122, and 124.

Peters, Laura, "Pursuing the Perfect Low–k Dielectric", *Semiconductor International*, vol. 21, No. 10, Sep., 1998, pp. 64–66, 68, 70, 72, and 74.

* cited by examiner

Primary Examiner—Carl Whitehead, Jr.
Assistant Examiner—Laura Schillinger
(74) Attorney, Agent, or Firm—John P. Taylor

(57) ABSTRACT

A process for forming a non-porous dielectric diffusion barrier layer on etched via and trench sidewall surfaces in a layer of porous low k dielectric material comprises exposing such etched surfaces to a plasma formed from one or more gases such as, for example, O$_2$; H$_2$; Ar; He; SiH$_4$; NH$_3$; N$_2$; CH$_x$F$_y$, where x=1–3 and y=4–y; H$_2$O; and mixtures of same, for a period of time sufficient to form from about 1 nanometer (nm) to about 20 nm of the non-porous dielectric diffusion barrier layer which prevents adsorption of moisture and other process gases into the layer of porous low k dielectric material, and prevents degassing from the porous low k dielectric material during subsequent processing.

6 Claims, 3 Drawing Sheets

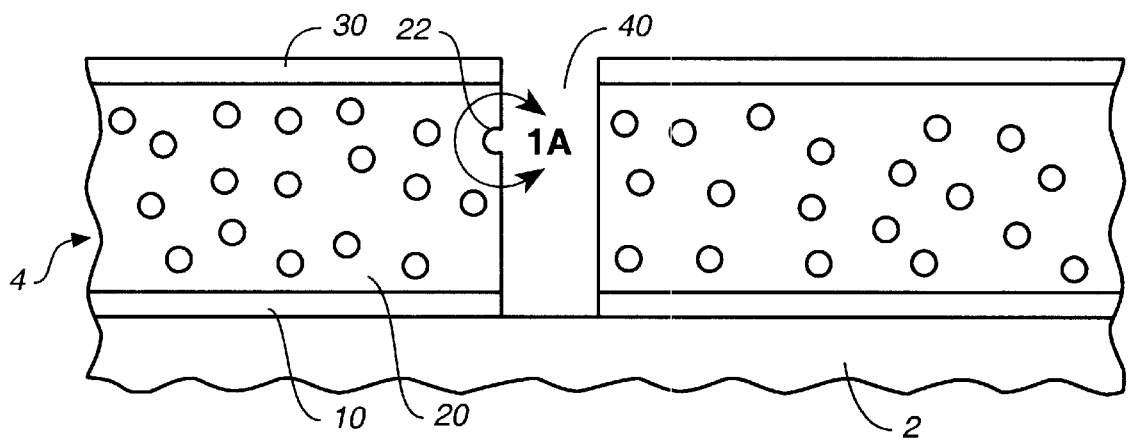
FIG._1 *(PRIOR ART)*
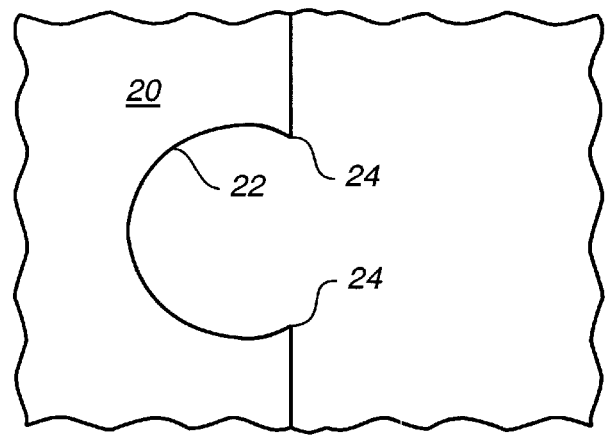
FIG._1A *(PRIOR ART)*

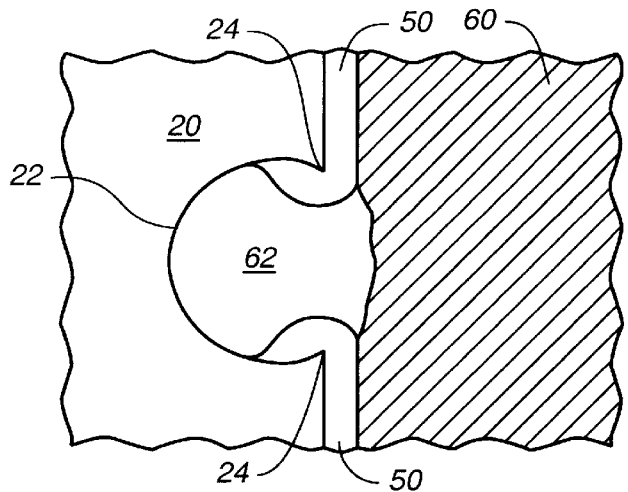
FIG._2
(PRIOR ART)
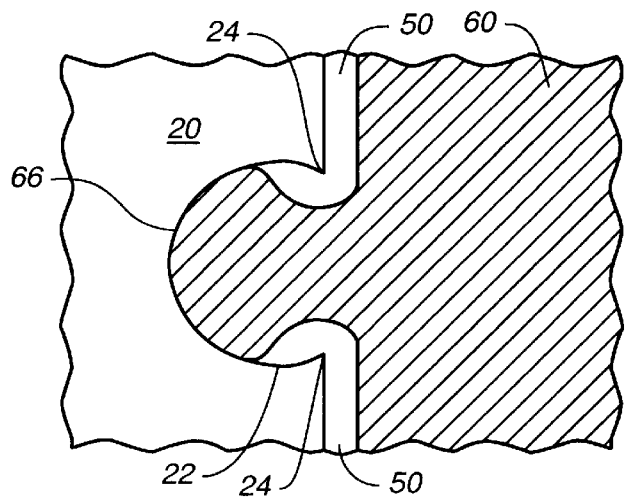
FIG._3
(PRIOR ART)
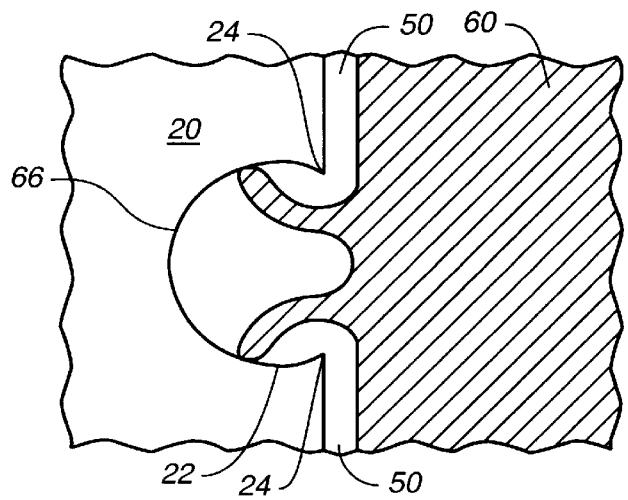
FIG._4
(PRIOR ART)

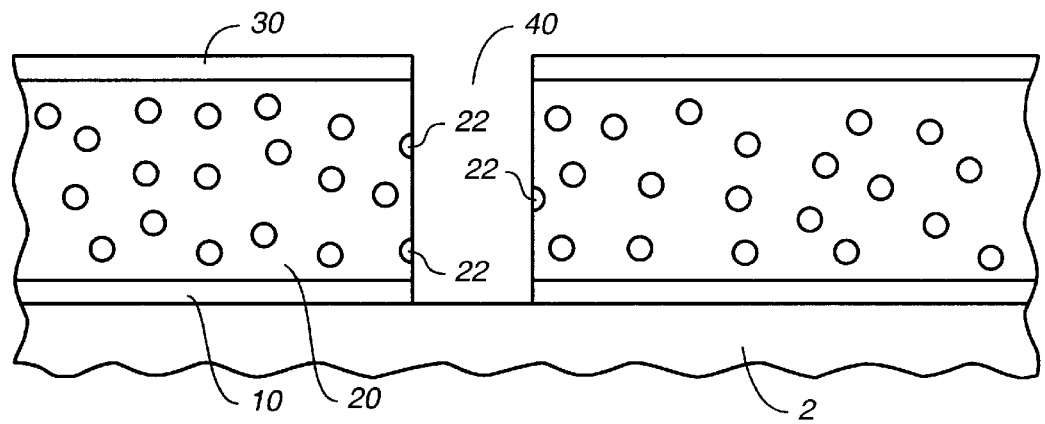
FIG._5
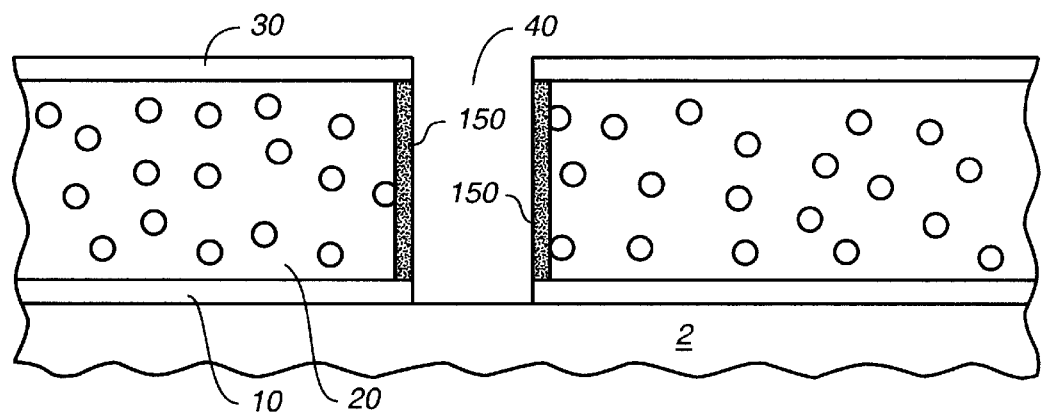
FIG._6

PROCESS FOR TREATING POROUS LOW K DIELECTRIC MATERIAL IN DAMASCENE STRUCTURE TO FORM A NON-POROUS DIELECTRIC DIFFUSION BARRIER ON ETCHED VIA AND TRENCH SURFACES IN THE POROUS LOW K DIELECTRIC MATERIAL

CROSS REFERENCE TO RELATED APPLICATIONS

The subject matter of this application relates to the subject matter of Catabay, Hsia, and Kabansky U.S. Pat. No. 6,346,490, issued Feb. 12, 2002, entitled "PROCESS FOR TREATING DAMAGED SURFACES OF LOW K CARBON-DOPED SILICON OXIDE DIELECTRIC MATERIAL AFTER PLASMA ETCHING AN PLASMA CLEANING STEPS", assigned to the assignee of this application, and the subject matter of which is hereby incorporated herein by reference.

The subject matter of this application relates to the subject matter of copending Catabay and Hsia U.S. patent application Ser. No. 09/884,736 entitled "PLASMA TREATMENT OF LOW DIELECTRIC CONSTANT DIELECTRIC MATERIAL TO FORM STRUCTURES USEFUL IN FORMATION OF METAL INTERCONNECTS AND/OR FILED VIAS FOR INTEGRATED CIRCUIT STRUCTURE", assigned to the assignee of this application, and the subject matter of which is hereby incorporated herein by reference.

The subject matter of this application relates to the subject matter of copending Kim U.S. patent application Ser. No. 09/932,527 entitled "PROCESS FOR REDUCING DEFECTS IN COPPER-FILLED VIAS AND/OR TRENCHES FORMED IN POROUS LOW-K DIELECTRIC MATERIAL" assigned to the assignee of this application, and the subject matter of which is hereby incorporated herein by reference.

The subject matter of this application relates to the subject matter of copending Kim and Chun U.S. patent application Ser. No. 10/032,666 entitled "PROCESS FOR REDUCING DEFECTS IN COPPER-FILLED VIAS AND/OR TRENCHES FORMED IN POROUS LOW-K DIELECTRIC MATERIAL" assigned to the assignee of this application, and the subject matter of which is hereby incorporated herein by reference.

BACKGROUND OF THE INVENTION

1. Field of the Invention

This invention relates to integrated circuit structures having copper-filled trenches and/or vias formed in porous low-k dielectric material. More particularly, the invention relates to an improvement in the process of forming such structures wherein a non-porous dielectric diffusion barrier layer is formed on etched via and trench sidewall surfaces in a layer of porous low k dielectric material by exposing such etched surfaces to a plasma formed from one or more gases to prevent adsorption of moisture and other process gases into the layer of porous low k dielectric material, and to prevent degassing from the porous low k dielectric to material during subsequent processing.

2. Description of the Related Art

The shrinking of integrated circuits has resulted in levels of electrically conductive interconnects being placed closer together vertically, as well as reduction of the horizontal spacing between the electrically conductive interconnects, such as metal lines, on any particular level of such interconnects. As a result, capacitance has increased between such conductive portions, resulting in loss of speed and increased cross-talk. One proposed approach to solving this problem of high capacitance is to replace the conventional silicon oxide ($SiO_2$) dielectric material, having a dielectric constant (k) of about 4.0, with another insulation material having a lower dielectric constant to thereby lower the capacitance.

In an article by L. Peters, entitled "Pursuing the Perfect Low-K Dielectric", published in Semiconductor International, Volume 21, No. 10, September 1998, at pages 64–74, a number of alternate dielectric materials are disclosed and discussed. Included in these dielectric materials is a description of a low k dielectric material having a dielectric constant of about 3.0 formed using a Flowfill chemical vapor deposition (CVD) process developed by Trikon Technologies of Newport, Gwent, U.K. The process is said to react methyl silane ($CH_3$—$SiH_3$) with hydrogen peroxide ($H_2O_2$) to form monosilicic acid which condenses on a cool wafer and is converted into an amorphous methyl-doped silicon oxide which is annealed at 400° C. to remove moisture.

An article by S. McClatchie et al. entitled "Low Dielectric Constant Oxide Films Deposited Using CVD Techniques", published in the 1998 Proceedings of the Fourth International Dielectrics For ULSI Multilevel Interconnection Conference (Dumic) held on Feb. 16–17, 1998 at Santa Clara, Calif., at pages 311–318, also describes the formation of methyl-doped. silicon oxide, by the low-k Flowfill process of reacting methyl silane with $H_2O_2$ to achieve a dielectric constant of 2.9.

However the replacement of conventional silicon oxide ($SiO_2$), having a dielectric constant of about 4.0, with low k dielectric material such as described above, creates problems such as, for example, its higher sensitivity to etchants used in formation of integrated circuit structures. Do This can result in damage to such low k material during the etching of openings therein for formation of vias and trenches. Densification of such non-porous low k dielectric material is known either to repair damage or to enhance the ability of such low k dielectric material to withstand damage from such etchants.

The aforementioned U.S. patent application Ser. No. 09/884,736 by the inventors of this invention teaches the densification of the surface of a layer of a non-porous low k dielectric material to permit formation of a hard mask or an etch stop layer from the resulting densified layer.

Sukharev, Uesato, Hu, Hsia, and Qian U.S. Pat. No. 6,114,259 teaches the treatment of non-porous low k dielectric material to form a densified layer over exposed surfaces of the low k dielectric material prior to the removal of the photoresist etch mask to protect the exposed low k dielectric material from the ashing treatment used to remove the etch mask.

The above-referenced Catabay, Hsai, and Kabansky U.S. Pat. No. 6,346,490, issued Feb. 12, 2002, discloses a process for treating exposed surfaces of non-porous low k dielectric material with an $N_2$ densification step after the via etch and then treating the via surfaces to a carbon-containing gas after the ashing step to remove the photoresist mask to repair damage caused by removal of the photoresist mask used to form the openings and removal of etch residues.

Another approach to the reduction of capacitance in integrated circuit structures is to further lower the dielectric constant (k) by introducing porosity into the dielectric layer.

Porous dielectric materials, and methods of making same, are described, for example, in Rostoker, Pasch, and Kapoor U.S. Pat. No. 5,393,712; Kapoor and Pasch U.S. Pat. No. 5,470,801; Kapoor and Pasch U.S. Pat. No. 5,598,026 (a division of U.S.Pat. No. 5,470,801); and Kapoor and Pasch U.S. Pat. No. 5,864,172 (a continuation of U.S. Pat. No. 5,598,026); all assigned to the assignee of this invention and the subject matter of all of which is hereby incorporated by reference. In these patents, a composite layer is formed on an integrated circuit structure comprising a dielectric material and an extractable material. The extractable material is removed from the composite layer, leaving a porous structure of dielectric material. Other forms of porous low k dielectric material are commercially available.

The above-mentioned shrinking of integrated circuits and the concurrent ever increasing demands for faster speeds, has also resulted in renewed interest in the use of copper as a filler material for vias and contact openings instead of tungsten, as well as for use in metal lines instead of aluminum because of the well known low electrical resistance of copper, compared to either aluminum or tungsten.

But there are negative aspects to the choice of copper for via filling, or in the formation of metal lines. The usual patterning of a blanket-deposited metal layer through a mask to form a pattern of metal lines or interconnects cannot easily be carried out using copper, resulting in the need to first deposit a dielectric layer such as silicon oxide, and then form a series of trenches in the dielectric layer corresponding to the desired pattern of metal lines or interconnects. The trench surfaces are then lined with a diffusion barrier layer or liner (to prevent migration of copper into the dielectric material, as well as to promote adhesion of the filler metal to the trench surfaces), and then filled with copper metal by first forming a copper seed layer over the barrier layer, e.g., by a CVD process, and then filling the remainder of the trench with a blanket deposition of copper, e.g., by a copper plating process.

While the combined use of a porous low-k dielectric material, such as described above, and a copper filler in the trenches and vias etched in such materials can result in the desired reduction in capacitance and enhanced speed, other problems have arisen due apparently to the combined use of a porous dielectric material and a copper filler for the trenches and/or vias etched in such porous dielectric material.

Referring to FIGS. 1 and 1A, an integrated circuit structure, denoted as 2, is shown having a composite layer porous dielectric structure generally indicated at 4 formed thereon comprising a non-porous lower barrier layer 10 of one or more dielectric materials, a porous low k dielectric layer 20, and an upper layer non-porous barrier layer 30 of one or more dielectric materials. An opening 40 is shown formed through dielectric layers 10, 20 and 30 to form a trench or via opening in composite layer structure 4.

Formation of such an opening 40 through layers 10, 20, and 30 often results in the opening of one or more pores, such as illustrated pore 22, in porous low k dielectric layer 20, resulting in the formation of pointed edges 24 remaining on the punctured or ruptured pore 22, as best seen in FIG. 1A. When a subsequent barrier liner layer 50, of e.g. 1A tantalum metal, is then formed as a liner over the etched surfaces of the trench/via opening 40 (as required when using copper filler material), the coverage of barrier liner 50 over the damaged pore 22 is inadequate, resulting in either subsequent non-filling of pore 22 with copper filler 60, creating a void 62 as shown in prior art FIG. 2, or a filling of pore 22 with copper filler, as shown in prior art FIG. 3, resulting in direct contact at 66 between copper filler 60 and the porous low k dielectric material of porous low k dielectric layer 20, or a combination of FIGS. 2 and 3, as shown in prior art FIG. 4.

The formation of voids resulting from inadequate filling of pore 22, as shown in FIG. 2, can result in a high resistance or disconnection (open) of copper line 60 at this point. The direct contact between copper filler 60 and porous low k dielectric layer 20 shown in FIGS. 3 and 4 can result in diffusion of copper atoms into porous dielectric layer 20, resulting in degradation of the dielectric properties of porous low k dielectric layer 20.

In the above referenced Kim U.S. patent application Ser. No. 09/932,527 the problem of rough edges from the rupturing of pores in porous low k dielectric material during the etching of openings for vias and/or trenches was solved by isotropic etching of the rough sidewalls of the openings to remove at least the peaks of the opened pores.

The above referenced Kim and Chun U.S. patent application Ser. No. 10/032,666 solved the same problem of rough edges from the rupturing of pores in porous low k dielectric material by depositing a further layer of dielectric material over the rough edges of the opened pores of the etched sidewalls of the openings in the porous low k dielectric material.

However, the etching of porous low k dielectric material and resulting rupture of adjacent pores create other problems in addition to the formation of rough edges on ruptured pores. Such porous low k dielectric material is more susceptible to adsorption of moisture and outgassing during subsequent processing under vacuum.

It would, therefore, be desirable to provide a structure and process wherein both a porous dielectric material and a copper filler could be used in the same integrated circuit structure without encountering any of the deleterious effects discussed above.

SUMMARY OF THE INVENTION

A process for forming a non-porous dielectric diffusion barrier layer on etched via and trench sidewall surfaces in a layer of porous low k dielectric material comprises exposing such etched surfaces to a plasma formed from one or more gases such as, for example, $O_2$; $H_2$; Ar; He; $SiH_4$; $NH_3$; $N_2$; $CH_xF_y$, where x=1–3 and y=4–y; $H_2O$; and mixtures of same, for a period of time sufficient to form from about 1 nanometer (nm) to about 20 nm of the non-porous dielectric diffusion barrier layer which prevents adsorption of moisture and other process gases into the layer of porous low k dielectric material, and prevents degassing from the porous low k dielectric material during subsequent processing.

BRIEF DESCRIPTION OF THE DRAWINGS

FIG. 1 is a fragmentary vertical cross-sectional view of a prior art composite of dielectric layers including a porous dielectric layer with a trench or via opening etched through the composite of dielectric layers which opens one of the pores in the porous dielectric layer.

FIG. 1A is an enlarged view of the portion of prior art FIG. 1 circled to better illustrate the rough edges caused by the puncture/rupture of the pore by the formation of the trench/via opening.

FIG. 2 is a fragmentary vertical cross-sectional view of the prior art structure of FIG. 1A after formation of a barrier layer over exposed surfaces of the trench/via opening in the porous dielectric layer and filling of the trench/via opening with copper, showing inadequate copper filling of the pore resulting in void formation.

FIG. 3 is a fragmentary vertical cross-sectional view of the prior art structure of FIG. 1A after formation of a barrier layer over exposed surfaces of the trench/via opening in the porous dielectric layer and filling of trench/via opening with copper, showing direct contact between the copper filler and the porous dielectric surface.

FIG. 4 is a fragmentary vertical cross-sectional view of the prior art structure of FIG. 1A after formation of a barrier layer over exposed surfaces of the trench/via opening in the porous dielectric layer and filling of the trench/via opening with copper, showing inadequate copper filling of the pore resulting in void formation, as also seen in FIG. 2, as well as showing direct contact between the copper filler and the porous dielectric surface, as also seen in FIG. 3.

FIG. 5 is a fragmentary vertical cross-sectional view of a composite of dielectric layers including a porous dielectric layer with a via opening etched through the composite of dielectric layers which opens several pores in the porous dielectric layer.

FIG. 6 is a fragmentary vertical cross-sectional view of the composite structure of FIG. 5 after treatment of the porous dielectric sidewalls of the via with a plasma to form a non-porous dielectric diffusion barrier layer over the porous dielectric material.

DETAILED DESCRIPTION OF THE INVENTION

The invention comprises a process for forming a non-porous dielectric diffusion barrier layer on etched via and trench sidewall surfaces in a layer of porous low k dielectric material by exposing such etched surfaces to a plasma formed from one or more gases such as, for example, $O_2$; $H_2$; Ar; He; $SiH_4$; $NH_3$; $N_2$; $CH_xF_y$, where x=1–3 and y=4–y; $H_2O$; and mixtures of same for a period of time sufficient to form from about 1 nm to about 20 nm of the non-porous dielectric diffusion barrier layer which prevents adsorption of moisture and other process gases into the layer of porous low k dielectric material, and prevents degassing from the porous low k dielectric material during subsequent processing.

The term "low k", as used herein, is intended to define a dielectric constant of a dielectric material of 3.5 or less. Preferably, the dielectric constant of a "low k" dielectric material will be 3.0 or less, and most preferably will be 2.5 or less. The term "porous low k", as used herein, is intended to define a dielectric constant of a dielectric material of 2.0 or less, and preferably 1.5 or less.

The densification step used to treat the surface of the layer of low k dielectric material to form the non-porous dielectric diffusion barrier layer is carried out after removal of the photoresist mask used to form the via or trench. The densification step comprises exposing the etched via or trench sidewall surfaces of the porous low k dielectric material to a plasma composed of ions which will penetrate into the porous low k dielectric material to form the desired thickness of the non-porous dielectric diffusion barrier layer which ranges from about 1 nm to about 20 nm, and preferably from about 5 nm to about 15 nm, with the typical thickness of the non-porous dielectric diffusion barrier layer comprising about 10 nm. It should be noted that the penetration of the plasma ions into the porous low k dielectric material forms the non-porous dielectric diffusion barrier layer which will prevent adsorption of moisture or other gases into the porous low k dielectric material and prevent degassing from the porous low k dielectric material during subsequent vacuum operations.

The time of the densification treatment will vary with the desired thickness of the layer of non-porous dielectric diffusion barrier material, as well as the pressure and temperature during the formation of the non-porous dielectric diffusion barrier layer. Care should be exercised to insure that the maximum treatment time is less than that period of time at which reactions could commence between the materials present during the treatment. Usually the time to form a non-porous dielectric diffusion barrier layer ranging in thickness from about 1 nm to about 20 nm will range from about 20 seconds to about 120 seconds As stated above, the thickness of the non-porous dielectric diffusion barrier layer will vary from about 1 nm to about 20 nm. Within this thickness range it is desirable to form the non-porous dielectric diffusion barrier layer as thin as possible without compromising the desired characteristics of the non-porous dielectric diffusion barrier layer. This is because the conversion of the porous low k dielectric material to non-porous dielectric diffusion barrier material will result in an increase in the dielectric constant (k) and the thinner the non-porous dielectric diffusion barrier layer thickness, the smaller the overall increase in the dielectric constant of the composite of dielectric layers.

The other reaction parameters used during the densification process may vary with the gas or gases used in the plasma, as well as any other materials present during the densification process and the desired thickness of the non-porous dielectric diffusion barrier layer. For example, when hydrogen gas is used, the power level should be maintained within a range of from about 500 to about 1500 watts, preferably from about 800 to about 1200 watts, and most preferably from about 900 to about 100 watts, with the typical power level being about 1000 watts. The plasma power source may be a single frequency power source, e.g., a conventional 13.56 MHz source, or such a source may be used in conjunction with a low frequency power source, such as a 600–800 Hz power supply, with one or the other of the power supplies usually coupled to the substrate support on which integrated circuit structure being treated is mounted.

The pressure in the reactor where the plasma densification treatment is being carried out should range from about 10 milliTorr to about 10 Torr, preferably from about 1 Torr to about 5 Torr, and most preferably from about 1 Torr to about 3 Torr, with the typical pressure being maintained at about 1 Torr.

It should also be noted that the plasma used for the densification should be somewhat isotropic to ensure the desired penetration of the ions in the plasma into the via and trench sidewalls of the layer of porous low k dielectric material. This can be accomplished empirically by adjustment of the above described plasma power level and pressure in the reactor.

The temperature of the densification treatment should be at least high enough to achieve the desired results efficiently without exceeding a temperature at which the porous low k dielectric material being treated might be damaged or destroyed, or the gases would begin to react with the porous low k dielectric material. Furthermore, when copper is present, the maximum temperature should be below that temperature at which the copper would be degraded or diffuse into undesired regions of the integrated circuit structure. The temperature of the densification treatment will range from about 10° C. to about 200° C., with a temperature range of <50° C. preferred.

Turning now to the figures, the results of the process are illustrated. In FIG. 5, similar to FIG. 1, an integrated circuit structure 2, is shown prior to formation of the non-porous dielectric diffusion barrier layer of the invention. A porous dielectric structure is shown formed on integrated circuit structure 2 comprising a non-porous lower barrier layer 10 of one or more dielectric materials, a porous low k dielectric layer 20, and an upper non-porous barrier layer 30 of one or more dielectric materials. An opening 40 is shown formed through dielectric layers 10, 20 and 30 to form a via opening in the composite layer structure. Porous layer 20 is shown with several open pores 22 resulting from the etching of porous low k dielectric layer 20 to form via opening 40.

FIG. 6 shows the structure of FIG. 5 after formation of non-porous dielectric diffusion barrier layer 150 by the process of the invention. It will be noted that open pores 22 are no longer present, having been incorporated into non-porous dielectric diffusion barrier layer 150 during its formation. Instead, non-porous dielectric diffusion barrier layer 150 provides a smooth surface to which may be bonded an electrically conductive liner such as tantalum, without the formation of voids which could, if present, result in contact between the porous low k dielectric material of layer 20 and a copper filler material used to subsequently fill via opening 40.

Thus, the process of the invention forms a non-porous dielectric diffusion barrier layer over exposed etched via or trench openings of a layer of porous low k dielectric material which smooths out rough edges of ruptured pores to thereby inhibit formation of voids and resultant contact between the porous low k dielectric material and copper filler. The non-porous dielectric diffusion barrier layer prevents adsorption of moisture or other process gases and also prevents degassing during subsequent processing steps under vacuum.

Having thus described the invention what is claimed is:

1. A process for forming, as a part of an integrated circuit structure on a substrate, a non-porous dielectric diffusion barrier layer on etched via and trench sidewall surfaces in a layer of porous low k dielectric material formed by reacting methyl silane ($CH_3SH_3$) with hydrogen peroxide ($H_2O_2$), said process comprising the steps of:
   a) exposing such etched surfaces of porous low k dielectric material to a plasma:
      i) formed from one or more gases selected from the group consisting of $O_2$; $H_2$; Ar; He; $SiH_4$; $NH_3$; $N_2$; $CH_xF_y$, where x=1–3 and y=4–y; $H_2O$; and mixtures of same; and
      ii) using both a 13.56 MHz power supply and a 600–800 Hz low frequency power supply, wherein at least one of said power supplies is coupled to a substrate support on which said substrate is mounted using said process; and
   b) maintaining said exposure for a period of time sufficient to form from about 1–20 nanometers (nm) of said non-porous dielectric diffusion barrier layer on said etched surfaces of said porous low k dielectric material;
wherein said non-porous dielectric diffusion barrier layer on said etched surfaces of said porous low k dielectric material prevents adsorption of moisture and other process gases into said layer of porous low k dielectric material, and prevents degassing from said porous low k dielectric material during subsequent processing.

2. The process of claim 1 wherein said period of time for said exposure of said etched surfaces to said plasma ranges from about 20 seconds to about 120 seconds.

3. The process of claim 1 wherein said etched surfaces are exposed to said plasma while maintaining a temperature ranging from about 10° C. to about 200° C.

4. The process of claim 1 wherein said etched surfaces are exposed to said plasma in a reactor maintained at a pressure ranging from about 1 torr to about 10 torr.

5. A process for forming, as a part of an integrated circuit structure on a substrate, copper-filled vias and trenches having a non-porous dielectric diffusion barrier layer on etched via and trench sidewall surfaces in a layer of porous low k dielectric material formed by reacting methyl silane ($CH_3SH_3$)i with hydrogen peroxide ($H_2O_2$), said process comprising the steps of:
   a) exposing such etched surfaces to a plasma:
      i) formed from one or more gases selected from the group consisting of Ar; He; $SiH_4$; $NH_3$; $N_2$; $CH_xF_y$, where x=1–3 and y=4–y; $H_2O$; mixtures of same; and mixtures of same with $O_2$ and/or $H_2$; and
      ii) using together a 13.56 MHz power source and a 600–800 Hz low frequency power supply to provide a plasma power level ranging from about 500 to about 1500 watts, wherein at least one of said power supplies is coupled to a substrate support on which said substrate is mounted using said process;
   b) carrying out said exposure for a period of time sufficient to form from about 1–20 nanometers (nm) of said non-porous dielectric diffusion barrier layer on said etched surfaces of said porous low k dielectric material;
   c) bonding to the surface of said non-porous dielectric diffusion barrier layer an electrically conductive liner; and
   d) filling with copper said lined vias and trenches having said non-porous dielectric diffusion barrier layer formed on the surfaces of said vias and trenches beneath said electrically conductive liner;
wherein said non-porous dielectric diffusion barrier layer on said etched surfaces of said porous low k dielectric material prevents adsorption of moisture and other process gases into said layer of porous low k dielectric material, prevents degassing from said porous low k dielectric material during subsequent processing, and facilitates bonding of said electrically conductive liner to said walls of said vias and said trenches.

6. A process for forming, as a part of an integrated circuit structure on a substrate, copper-filled vias and trenches having a non-porous dielectric diffusion barrier layer on etched via and trench sidewall surfaces in a layer of porous low k dielectric material formed by reacting methyl silane ($CH_3SH_3$)i with hydrogen peroxide ($H_2O_2$), said process comprising the steps of:
   a) exposing such etched surfaces to a plasma:
      i) formed from one or more gases selected from the group consisting of Ar; He; $SiH_4$; $NH_3$; $N_2$; $CH_xF_y$, where x=1–3 and y=4–y; $H_2O$; and mixtures of same; and
      ii) using together a 13.56 MHz power source and a 600–800 Hz low frequency power supply to provide a plasma power level ranging from about 500 to about 1500 watts, wherein at least one of said power supplies is coupled to a substrate support on which said substrate is mounted using said process;
   b) carrying out said exposure for a period of time sufficient to form from about 1–20 nanometers (nm) of said non-porous dielectric diffusion barrier layer on said etched surfaces of said porous low k dielectric material;
   c) bonding to the surface of said non-porous dielectric diffusion barrier layer an electrically conductive liner; and d) filling with copper said lined vias and trenches having said non-porous dielectric diffusion barrier layer formed on the surfaces of said vias and trenches beneath said electrically conductive liner;

wherein said non-porous dielectric diffusion barrier layer on said etched surfaces of said porous low k dielectric material prevents adsorption of moisture and other process gases into said layer of porous low k dielectric material, prevents degassing from said porous low k dielectric material during subsequent processing, and facilitates bonding of said electrically conductive liner to said walls of said vias and said trenches.

* * * * *